(12) United States Patent
Nagawa et al.

(10) Patent No.: US 7,312,476 B2
(45) Date of Patent: Dec. 25, 2007

(54) OPTICAL ELEMENT AND ITS MANUFACTURING METHOD

(75) Inventors: Michifumi Nagawa, Fujimi-machi (JP); Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 11/151,371

(22) Filed: Jun. 14, 2005

(65) Prior Publication Data

US 2006/0008623 A1  Jan. 12, 2006

(30) Foreign Application Priority Data

Jul. 6, 2004  (JP) ............... 2004-199332

(51) Int. Cl.
*H01L 33/00* (2006.01)
(52) U.S. Cl. ............... 257/98; 257/99; 257/100; 257/81; 257/432
(58) Field of Classification Search ............... 257/81, 257/84, 99, 100, 98, 432, E31.106, E31.127
See application file for complete search history.

(56) References Cited

U.S. PATENT DOCUMENTS

| | | | |
|---|---|---|---|
| 5,528,071 A * | 6/1996 | Russell et al. ............... 257/458 |
| 7,064,907 B2 * | 6/2006 | Kaneko ............... 359/811 |
| 2002/0150135 A1 | 10/2002 | Naone et al. |
| 2006/0008623 A1 * | 1/2006 | Nagawa et al. ............... 428/172 |
| 2006/0056473 A1 * | 3/2006 | Tanigawa et al. ............... 372/43.01 |
| 2006/0057756 A1 * | 3/2006 | Sato et al. ............... 438/50 |

FOREIGN PATENT DOCUMENTS

| | | |
|---|---|---|
| EP | 0 559 347 A1 | 9/1993 |
| JP | A-04-028231 | 1/1992 |
| JP | A-2004-031633 | 1/2004 |
| JP | A-2004-288971 | 10/2004 |
| WO | WO 01/71820 A2 | 9/2001 |

* cited by examiner

*Primary Examiner*—Thao P. Le
(74) *Attorney, Agent, or Firm*—Oliff & Berridge, PLC

(57) ABSTRACT

To improve the reliability of an optical element and its manufacturing method. An optical element 100 includes a substrate 110, a columnar section 130 formed above the substrate 110 and having an upper surface 132 for light emission or incidence, a resin layer 140 formed above the substrate 110 and in a region including a circumference of the columnar section 130, a reinforcing layer 180 that is formed above the resin layer 140 and is composed of a material harder than the resin layer 140, and an electrode 150 that has a bonding section 156 formed above the reinforcing layer 180 and is electrically connected to an end section of an exposed area in the upper surface 132 of the columnar section 130.

20 Claims, 7 Drawing Sheets

OPTICAL ELEMENT AND ITS MANUFACTURING METHOD

This application claims the benefit of Japanese Patent Application No. 2004-199332 filed Jul. 6, 2004. The entire disclosure of the prior application is hereby incorporated by reference herein in its entirety.

BACKGROUND

The present invention relates to optical elements and a method for manufacturing the same.

As optical elements, those having a structure that includes a substrate, a columnar section for light emission or incidence formed above the substrate, a resin layer formed above the substrate and around the columnar section, and an electrode that passes over the resin layer and is electrically connected to an upper surface of the columnar section are known. According to this, because the resin layer is soft, the resin layer may deform when a wire or the like is bonded to an electrode on the resin layer.

To improve the bonding property, it is known that a stress relieving layer composed of a hard material may be provided below the resin layer (Patent Document 1). However, this configuration is not sufficient to prevent deformation of the resin layer. When the resin layer deforms, the electrode might peel off, and the reliability in electrical connection could not be maintained.

[Patent Document 1] Japanese Laid-open Patent Application 2004-31633.

It is an object of the present invention to improve the reliability concerning optical elements and methods for manufacturing the same.

SUMMARY (1) An optical element in accordance with the present invention includes:
  a substrate;
  a columnar section formed above the substrate and having an upper surface for light emission or incidence;
  a resin layer formed above the substrate and in a region including a circumference of the columnar section;
  a reinforcing layer that is formed above the resin layer and is composed of a material harder than the resin layer; and
  an electrode that has a bonding section formed above the reinforcing layer and is electrically connected to an end section of an exposed area in the upper surface of the columnar section.

In accordance with the present invention, because the reinforcing layer of a hard material is positioned as a base below the bonding section, deformation of the resin layer that may be originated from stresses caused at the time of bonding can be effectively prevented, compared to the case where a soft resin layer is provided as a base. Also, peeling of and damage to the electrode which may be caused by deformation of the resin layer can be prevented.

It is noted that, in the present invention, the case where a layer B is provided above a specific layer A includes a case where the layer B is provided directly on the layer A, and a case where the layer B is provided above the layer A through another layer.

(2) In the optical element, the reinforcing layer may be formed in a region including the entirety of the bonding section.

(3) In the optical element, the reinforcing layer may be formed in a region including the entirety of the resin layer.

By this, the reinforcing layer holds down and protects the entirety of the resin layer, such that the resin layer is effectively prevented from being deformed by external stresses. Also, the resin layer can be protected by the reinforcing layer.

(4) In the optical element, the resin layer may be formed in a portion above the substrate.

(5) In the optical element, the reinforcing layer may be formed in a region including the entirety of the resin layer and outside the resin layer.

By this, the reinforcing layer can protect the resin layer and the region outside thereof.

(6) In the optical element, the reinforcing layer may be composed of an inorganic material.

(7) In the optical element, the reinforcing layer may be composed of a metal.

(8) In the optical element, the resin layer may include a first section above the substrate and around the columnar section, and a second section provided at the end section of the upper surface of the columnar section.

(9) A method for manufacturing an optical element in accordance with the present invention includes:
  (a) forming, above a substrate, a columnar section having an upper surface for light emission or incidence;
  (b) forming a resin layer above the substrate and in a region including a circumference of the columnar section;
  (c) forming, above the resin layer, a reinforcing layer composed of a material harder than the resin layer; and
  (d) forming an electrode that has a bonding section above the reinforcing layer and is electrically connected to an end section of an exposed area in the upper surface of the columnar section.

In accordance with the present invention, because the reinforcing layer of a hard material is positioned as a base below the bonding section, deformation of the resin layer which may be originated from stresses caused at the time of bonding can be effectively prevented, compared to the case where a soft resin layer is provided as a base. Also, peeling of and damage to the electrode which may be caused by deformation of the resin layer can be prevented.

It is noted that, in the present invention, the case where a layer B is provided above a specific layer A includes a case where the layer B is provided directly on the layer A, and a case where the layer B is provided above the layer A through another layer.

DETAILED DESCRIPTION OF EMBODIMENTS

Embodiments of the present invention are described below with reference to the accompanying drawings.

First Embodiment

1. Optical Element

Figure 1:
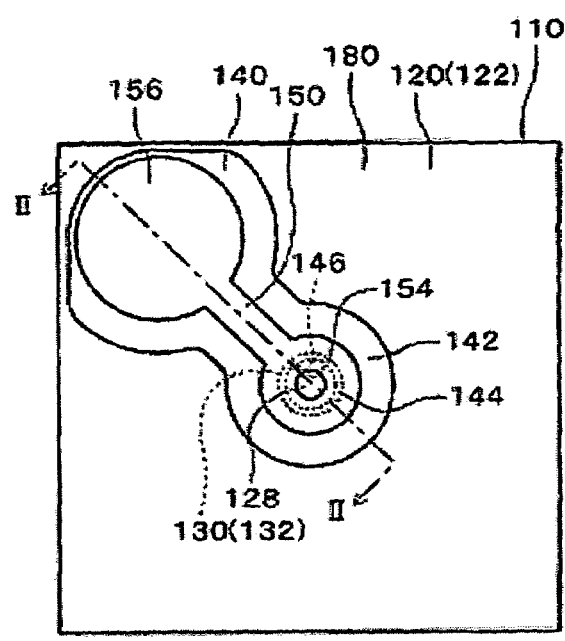
FIG. 1 is a plan view of an optical element in accordance with a first embodiment of the present invention.
Figure 2:
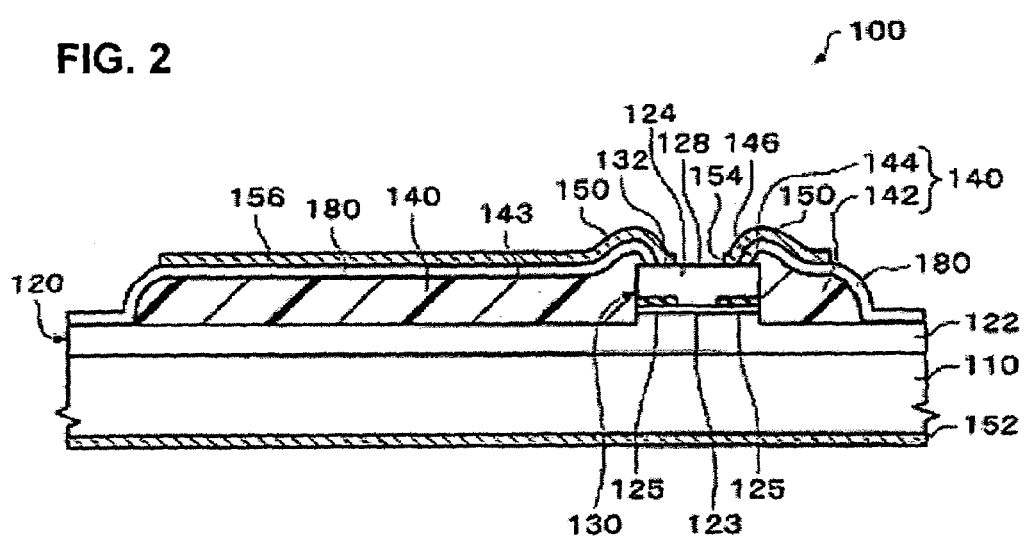
FIG. 2 is a cross-sectional view of the optical element in accordance with the first embodiment of the present invention.
Figure 12:
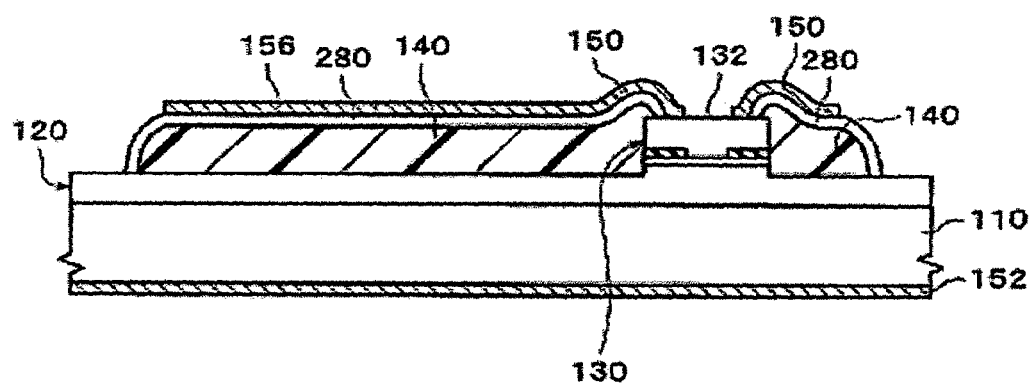
FIG. 12 is a cross-sectional view of an optical element in accordance with a modified example of the first embodiment of the present invention.
Figure 13:
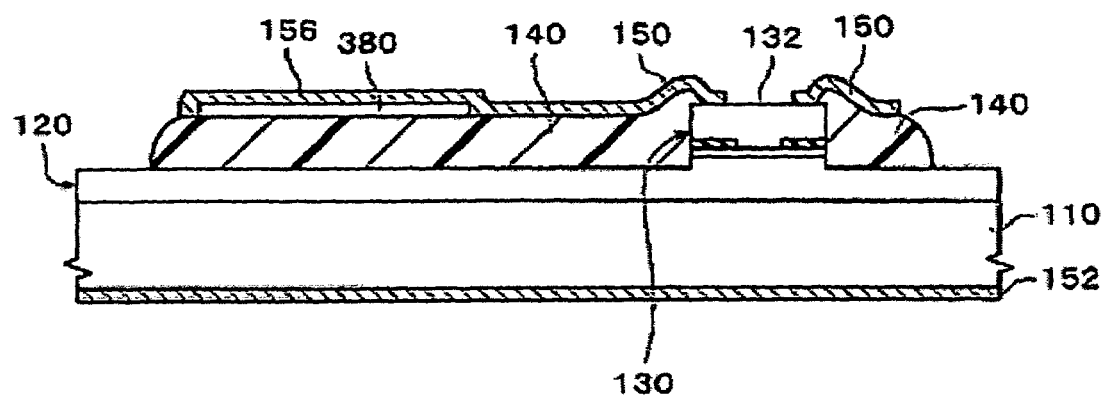
FIG. 13 is a cross-sectional view of an optical element in accordance with a modified example of the first embodiment of the present invention.

FIG. 1 is a plan view of an optical element in accordance with a first embodiment of the present invention. FIG. 2 is a cross-sectional view of the optical element in accordance with the present embodiment, and is a cross-sectional view taken along lines II-II of FIG. 1. Also, FIG. 12 and FIG. 13 are cross-sectional views of optical elements in accordance with modified examples of the present embodiment.

The optical element 100 in accordance with the present embodiment includes a substrate 110, a columnar section 130, a resin layer 140, a reinforcing layer 180, and electrodes 150 and 152. In the present embodiment, an example in which the optical element 100 is a surface-emitting type semiconductor laser is described.

The substrate 110 is a semiconductor substrate (for example, an n-type GaAs substrate). The columnar section 130 is supported on the substrate 110. The columnar section 130 has a columnar configuration, for example. In the example shown in FIG. 1, one substrate 110 includes one columnar section 130, but it may include a plurality of columnar sections 130. A center portion of an upper surface 132 of the columnar section 130 defines an optical surface 128 where light (laser beam) is emitted. The optical surface 128 is exposed through the resin layer 140, the reinforcing layer 180 and the electrode 150.

In the example shown in FIG. 2, an element section 120 is formed over the substrate 110, and a part of the element section 120 defines the columnar section 130. The element section 120 has a cross-sectional shape that is a convex shape. The substrate 110 and the element section 120 may have plane configurations that are identical to each other (for example, in a rectangular shape). Alternatively, the plane configuration of the element section 120 may be smaller than the plane configuration of the substrate 110, such that a part of the substrate 110 may be exposed through the element section 120. In the case of the surface-emitting type semiconductor laser, the element section 120 is called a resonator (vertical resonator).

The element section 120 is formed from, for example, a first mirror 122 that is a distributed reflection type multilayer mirror of 40 pairs of alternately laminated n-type $Al_{0.9}Ga_{0.1}As$ layer and n-type $Al_{0.15}Ga_{0.85}As$ layer, an active layer 123 composed of GaAs well layers and $Al_{0.3}Ga_{0.7}As$ barrier layers in which the well layers include a quantum well structure composed of three layers, and a second mirror 124 that is a distributed reflection type multilayer mirror of 25 pairs of alternately laminated p-type $Al_{0.9}Ga_{0.1}As$ layer and p-type $Al_{0.15}Ga_{0.85}As$ layer, which are successively stacked in layers. It is noted that the composition of each of the layers and the number of the layers forming the first mirror 122, the active layer 123 and the second mirror 124 are not limited to the above.

The second mirror 124 is formed to be p-type by, for example, doping C, Zn, Mg or the like, and the first mirror 122 is formed to be n-type by, for example, doping Si, Se or the like. Accordingly, the second mirror 124, the active layer 123 in which no impurity is doped, and the first mirror 122 form a pin diode.

A current constricting layer 125, which is composed of aluminum oxide as a main component, is formed in a region near the active layer 123 among the layers composing the second mirror 124. The current constricting layer 125 is formed in a ring shape. In other words, the current constricting layer 125 has cross sections that are concentric, when cut in a plane parallel with the optical surface 128.

The columnar section 130 refers to a semiconductor laminated boy that includes at least the second mirror 124 (for example, the second mirror 124, the active layer 123 and a part of the first mirror 122). The columnar section 130 is formed above the substrate 110 through another part of the element section 120.

The resin layer 140 is formed in contact with the columnar section 130. In the example shown in the present embodiment, the resin layer 140 includes a first section 142 formed above the substrate 110 and around the columnar section 130, and a second section 144 formed at an end section of the upper surface 132 of the columnar section 130. The resin layer 140 may be formed from, for example, polyimide resin, fluororesin, acrylic resin, epoxy resin or the like. In particular, it may preferably be formed from polyimide resin or fluororesin, in view of the easiness of processing and dielectric property.

The first section 142 of the resin layer 140 may be formed over the element section 120, and may entirely cover a side surface 134 of the columnar section 130. By this, the side surface of the columnar section 130 can be protected by the resin layer 140. The first section 142 can overlap a part of the substrate 110, as shown in FIG. 1, or may entirely overlap the substrate 110 except the area of the columnar section 130. In the example shown in FIG. 2, an upper surface 143 of the first section 142 may be at a position lower than, or generally at the same height as, or at a position higher than the upper surface 132 of the columnar section 130. When the resin layer 140 is thick, the parasitic capacitance floating between the electrode 150 and the substrate 110 (electrode 152) can be reduced, and the high-frequency property can be improved. Accordingly, the reliability of the optical element can be improved. Also, in the example shown in FIG. 2, the thickness of the first section 142 is generally uniform. Alternatively, the thickness of the first section 142 may become smaller as it extends away from the columnar section 130. In other words, the upper surface 143 of the first section 142 may be gently sloped so that it becomes lower as it extends away from the columnar section 130.

The second section 144 of the resin layer 140 is formed in a manner to avoid the optical surface 128. The second section 144 is formed in one piece (continuously) with the first section 142. The resin layer 140 covers a corner section between the upper surface 132 and the side surface 134 of the columnar section 130, and the second section 144 further covers the end section of the upper surface 132 of the columnar section 130. When the upper surface 143 of the first section 142 is generally at the same height as or lower than the upper surface 132 of the columnar section 130, the first section 142 elevates as it approaches the columnar section 130, as shown in FIG. 2. When the width (diameter) of the upper surface 132 of the columnar section 130 is about 35-40 µm, the second section 144 may cover an area that extends by about 3-12 µm from the circumference toward the center of the upper surface 132 of the columnar section 130. With the numerical range described above, when the resin layer 140 is patterned by using a mask, positioning errors of the mask can be absorbed by the range, such that the second section 144 can be securely formed in view of the manufacturing process.

As shown in FIG. 1, the second section 144 may be formed continuously along the circumference of the upper surface 132 of the columnar section 130. For example, the second section 144 may be formed in a ring shape. In this case, an opening section 146 of the resin layer 140 is formed on the upper surface 132 of the columnar section 130. By this, the corner section along the entire circumference of the upper surface 132 of the columnar section 130 is covered, such that a very high level of adhesion is achieved between the resin layer 140 and the columnar section 130. Also, the side surface 134 of the columnar section 130 is completely covered, such that the columnar section 130 is not exposed to open air except the optical surface 128, and therefore the reliability of the optical element can be improved.

Alternatively, the second section 144 of the resin layer 140 may be formed in a part of the circumference of the upper surface 132 of the columnar section 130. In other words, the second section 144 may not be formed continuously along the circumference of the upper surface 132 of the columnar section 130. Alternatively, the resin layer 140 may not be formed on the upper surface 132 of the columnar section 130, but may be formed only around the columnar section 130.

Also, as shown in FIG. 2, the second section 144 may have a thickness that becomes smaller in a direction from the circumference toward the center of the upper surface 132 of the columnar section 130. The upper surface of the second section 144 may be formed with a smooth curved surface. By this, an electrode 150 to be described below can be formed, smoothly sloped according to the shape of the second section 144 of the resin layer 140, such that disconnection of the electrode 150 can be effectively prevented.

The reinforcing layer 180 is formed on the resin layer 140, and is composed of a material harder (a material of a Young's modulus greater) than the resin layer 140. For example, when the resin layer 140 having a Young's modulus of about 0.3 Gpa-5 Gpa is used, the reinforcing layer 180 having a Young's modulus of about 10 GPa-100 Gpa may be used. For example, the reinforcing layer 180 may be composed of a material harder than a polyimide rein layer (having a Young's modulus of about 2.07 GPa). The reinforcing layer 180 is not limited to a specific thickness, but may be about 100 nm-500 nm (more preferably, 300 nm-500 µm) in thickness. When the reinforcing layer 180 is thick, deformation of the resin layer 140 can be effectively prevented. For example, compared with the case where the reinforcing layer 180 is not formed, peeling of the electrode 150 can be better prevented by a rate of 50% when the thickness is 100 nm, 67% when the thickness is 200 nm, and 85% when the thickness is 300 nm. It is noted that the reinforcing layer 180 may be formed from a dielectric material, or may be formed from a conductive material. Also, the reinforcing layer 180 may be formed thicker than the resin layer 140, for example.

The reinforcing layer 180 may be formed from an inorganic material such as an oxide or a nitride. For example, the reinforcing layer 180 may be a silicon oxide layer (having a Young's modulus of about 92 GPa), or a silicon nitride layer (having a Young's modulus of about 14.6 GPa). When the reinforcing layer 180 is formed from an inorganic material, it achieves better adhesion with the electrode 150 than with the resin layer 140, such that peeling of the electrode 150 is effectively prevented.

Alternatively, the reinforcing layer 180 may be formed from a metal. For example, the reinforcing layer 180 may be a gold layer (having a Young's modulus of about 79 GPa). In this case, the reinforcing layer 180 may be formed from a material different from that of a layer in the electrode 150 which is in contact with the reinforcing layer 180.

The electrode (first electrode) 150 has a bonding section 156, wherein at least a part of the bonding section 156 is formed on the reinforcing layer 180. More specifically, at least a part of the bonding section 156 overlaps both of the resin layer 140 and the reinforcing layer 180. By this, the reinforcing layer 180 of a hard material is positioned as a base below the bonding section 156, such that deformation of the resin layer 140 that may be caused by stresses at the time of bonding can be effectively prevented.

The bonding section 156 is a section for external electrical connection. The bonding section 156 includes a region where a conductive material (not shown) such as a wire, a bump or the like is bonded. The mode for bonding the optical element 100 may be either a face-up mounting or a face-down mounting.

As shown in FIG. 1, the reinforcing layer 180 may be formed in a region that includes the entirety of the resin layer 140, and an area outside the resin layer 140. More specifically, as shown in FIG. 2, the reinforcing layer 180 covers the entirety of the resin layer 140, and also covers the element section 120 (or the substrate 110) that is exposed through the resin layer 140. The reinforcing layer 180 may overlap the entirety of the plane configuration of the substrate 110. In this case, the reinforcing layer 180 is formed in a manner to avoid the optical surface 128. By this, the reinforcing layer 180 holds down and protects the entirety of the resin layer 140, such that the resin layer 140 is effectively prevented from being deformed by external stresses such as stresses at the time of bonding. Also, the reinforcing layer 180 functions as a protection material for the resin layer 140 and the element section 120 (or the substrate 110), such that the reliability against external environments (heat, humidity, chemicals or the like) can be improved.

It is noted here that the forming region of the reinforcing layer is not limited to those described above, and many modifications can be made.

As a modified example, FIG. 12 shows an example in which a reinforcing layer 280 is formed in a region that includes the entirety of the resin layer 140. Furthermore, the reinforcing layer 280 is formed only on the resin layer 140, but is not formed on the element section 120 (or the substrate 110) that is exposed through the resin layer 140. When the reinforcing layer 280 is formed in a manner to expose a portion outside the resin layer 140, for example, an electrode 152 can be formed in the exposed portion. Also, because the reinforcing layer 280 holds down and protects at least the entire resin layer 140, the effects described above can be achieved.

As another modified example, FIG. 13 shows an example in which a reinforcing layer 380 is formed in a region that includes the entirety of the bonding section 156. Furthermore, the reinforcing layer 380 is formed only on the bonding section 156 (or in a region slightly larger than the bonding section 156), but is not formed in a part of the resin layer 140. When the reinforcing layer 380 is formed on the bonding section 156, deformation of the resin layer 140 caused by stresses at the time of bonding can be effectively prevented.

As shown in FIG. 2, the electrode 150 passes above the first and second sections 142 and 144 of the resin layer 140, and is electrically connected to an end section of the exposed area in the upper surface 132 of the columnar section 130. The electrode 150 is formed continuously along the circumference of the exposed area. For example, a portion of the electrode 150 which is in contact with the upper surface 132 of the columnar section 130 may be formed in a ring shape. By so doing, an electric current can be uniformly flown to the columnar section 130. The electrode 150 may be composed of a laminated film of, for example, Au and an alloy of Au and Zn. Also, a Cr film may be added to the film, such that its adhesion with the resin layer 140 or the reinforcing layer 180 can be improved. On the other hand, in the example shown in FIG. 2, an electrode (second electrode) 152 is formed on the back surface of the substrate 110. The electrode 152 is composed of a laminated film of, for example, Au and an alloy of Au and Ge. By this, an electric current can be flown in the active layer 123 between the first and second mirrors 122 and 124 by the electrodes 150 and 152. It is noted that the materials of the electrodes 150 and 152 are not limited to the aforementioned materials, and, for example, metals such as Ti, Ni, Au and Pt, and an alloy of these metals can be used.

Here, an example of a method for driving the optical element (surface-emitting semiconductor laser) is described below. When a voltage is applied in a forward direction to the pin diode between the electrodes 150 and 152 in the optical element 100, recombinations of electrons and holes occur in the active layer 123, thereby causing emission of light due to the recombinations. Stimulated emission occurs during the period the generated light reciprocates between the second mirror 124 and the first mirror 122, whereby the light intensity is amplified. When the optical gain exceeds the optical loss, laser oscillation occurs, and a laser beam is emitted from the optical surface 128 (emission surface) at the upper surface 132 of the columnar section 130 in a direction perpendicular to the substrate 110.

By the optical element in accordance with the present embodiment, the reinforcing layer 180 of a hard material is located as a base below the bonding section 156, deformation of the resin layer 140 which may be originated from stresses caused at the time of bonding can be effectively prevented, compared to the case where the soft resin layer 140 is provided as a base. In other words, stresses to the electrode 150 generated at the time of bonding can be prevented from transferring to the resin layer 140. Also, peeling of and damage to the electrode 150 caused by deformation of the resin layer 140 can be prevented.

Also, when the resin layer 140 is formed up to the end section of the upper surface 132 of the columnar section 130, adhesion between the resin layer 140 and the columnar section 130 can be improved. For this reason, even when the resin layer 140 contracts by heat more than the columnar section 130, the resin layer 140 can be prevented from peeling off the columnar section 130, and disconnection of the electrode 150 can be prevented accordingly. In other words, stresses that originate from hardening and contraction of the resin layer 140 can be alleviated, such that disconnection of the electrode 150 can be prevented.

Also, there are advantages in that the reliability of the optical element can be improved without making the mechanical characteristic values (thermal expansion coefficient and the like) of the resin layer 140 to be the same or similar values of, for example, the substrate 110 and the columnar section 130, and therefore the degree of freedom in material selection is great.

It is noted that optical elements to which the present invention is applicable are not limited to surface-emitting type semiconductor lasers, and may include other light emission elements (for example, semiconductor light emission diodes and organic LEDs), and also light reception elements (for example, photodiodes). In the case of a light reception element, the optical surface of the columnar section 130 defines a light incidence surface. Moreover, an optical member such as a microlens or the like (not shown) may be provided over the upper surface 132 (optical surface 128) of the columnar section 130.

Also, the p-type and n-type characteristics of each of the semiconductors described above can be interchanged. In the example described above, the description is made as to an AlGaAs type, but depending on the oscillation wavelength to be generated, other materials, such as, for example, GaInP type, ZnSSe type, InGaN type, AlGaN type, InGaAs type, GaInNAs type, GaAsSb type, and like semiconductor materials can be used.

2. Method for Manufacturing Optical Element

FIG. 3-FIG. 11 are views showing a method for manufacturing an optical element in accordance with the first embodiment of the present invention.

Figure 3:
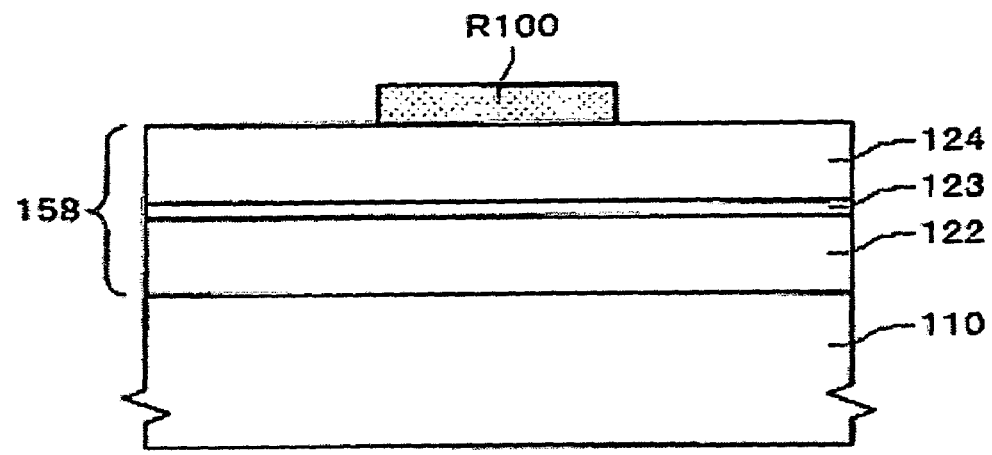
FIG. 3 is a view showing a method for manufacturing an optical element in accordance with the first embodiment of the present invention.
Figure 4:
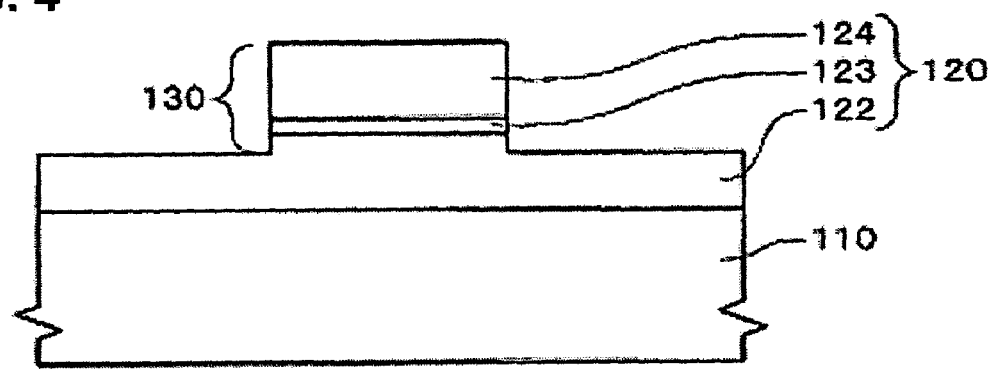
FIG. 4 is a view showing the method for manufacturing the optical element in accordance with the first embodiment of the present invention.
Figure 5:
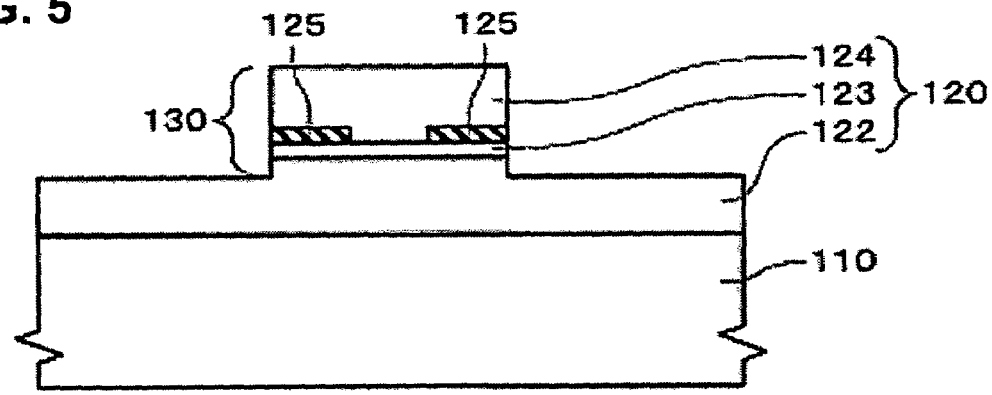
FIG. 5 is a view showing the method for manufacturing the optical element in accordance with the first embodiment of the present invention.
Figure 6:
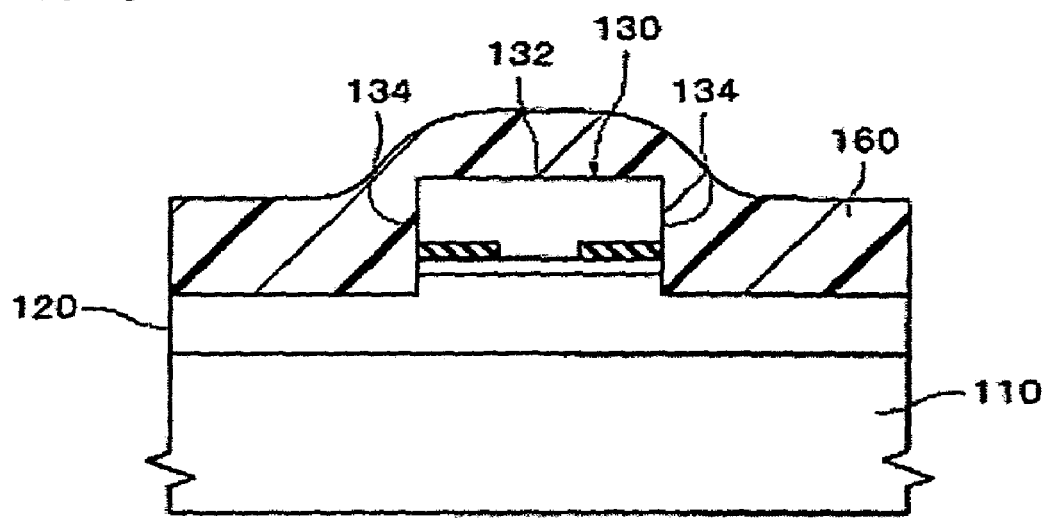
FIG. 6 is a view showing the method for manufacturing the optical element in accordance with the first embodiment of the present invention.

(1) First, an element section 120 including a columnar section 130 is formed (see FIG. 3-FIG. 5).

As shown in FIG. 3, on the surface of a semiconductor substrate 110 composed of n-type GaAs, a semiconductor multilayer film 158 is formed by epitaxial growth while modifying its composition. It is noted here that the semiconductor multilayer film 158 is formed from, for example, a first mirror 122 of 40 pairs of alternately laminated n-type $Al_{0.9}Ga_{0.1}As$ layers and n-type $Al_{0.15}Ga_{0.85}As$ layers, an active layer 123 composed of GaAs well layers and $Al_{0.3}Ga_{0.7}As$ barrier layers in which the well layers include a quantum well structure composed of three layers, and a second mirror 124 of 25 pairs of alternately laminated p-type $Al_{0.9}Ga_{0.1}As$ layers and p-type $Al_{0.15}Ga_{0.85}As$ layers. These layers are successively stacked in layers on the semiconductor substrate 110 to thereby form the semiconductor multilayer film 158.

When growing the second mirror 124, at least one layer thereof adjacent to the active layer 123 is formed as an AlAs layer or an AlGaAs layer with its Al composition being 0.95 or greater. This layer is later oxidized and becomes a current constricting layer 125 (see FIG. 5). Also, the uppermost surface layer of the second mirror 124 may preferably be formed to have a high carrier density such that ohm contact can be readily made with an electrode 150.

The temperature at which the epitaxial growth is conducted is appropriately decided depending on the growth method, the kind of raw material, the type of the semiconductor substrate 110, and the kind, thickness and carrier density of the semiconductor multilayer film 158 to be formed, and in general, may preferably be 450° C.-800° C. Also, the time required for conducting the epitaxial growth is appropriately decided like the temperature. Also, a metal-organic vapor phase growth (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Next, resist is coated on the semiconductor multilayer film 158, and then the resist is patterned by a lithography method, thereby forming a resist layer R100 having a specified pattern, as shown in FIG. 3. The resist layer R100 is formed above an area where a columnar section 130 (see FIG. 1 and FIG. 2) is to be formed. Next, by using the resist layer R100 as a mask, the second mirror 124, the active layer 123, and a part of the first mirror 122 are etched by, for example, a dry etching method, thereby forming a columnar section 130, as shown in FIG. 4. Then, the resist layer R100 is removed.

Next, by placing the substrate 110 on which the columnar section 130 is formed through the aforementioned steps in a water vapor atmosphere at about 400° C., for example, the layer having a high Al composition (a layer with an Al composition being 0.95 or higher) provided in the second mirror 124 is oxidized from its side surface, thereby forming a current constricting layer 125, as shown in FIG. 5. The oxidation rate depends on the temperature of the furnace, the amount of water vapor supply, and the Al composition and the film thickness of the layer to be oxidized. When the surface-emitting type semiconductor laser equipped with the current constricting layer 125 described above is driven, a current flows only in a portion where the current constricting layer 125 is not formed (a portion that is not oxidized). Accordingly, in the step of forming the current constricting layer 125 by oxidation, the forming region of the current constricting layer 125 may be controlled, whereby the current density can be controlled.

(2) Next, a resin layer 140 is formed (see FIG. 6-FIG. 11).

First, a resin layer precursor layer 160 is provided in a manner to entirely overlap the substrate 110. The resin layer precursor layer 160 is provided to cover upper surface 132 and side surface 134 of the columnar section 130, and also to over other portions of the element section 120. The resin layer precursor layer 160 may be coated by, for example, a spin coat method. Alternatively, any one of other known techniques, such as, a dipping method, a spray coat method, a liquid droplet ejection method (for example, an ink jet method) or the like can be used. The resin layer precursor layer 160 may be upheaved according to the protrusion of the columnar section 130. Alternatively, the resin layer precursor layer 160 may be formed to have a flat upper surface further above the columnar section 130.

The resin layer precursor layer 160 may be patterned by using a wet-etching step (dissolving and removal step). The wet-etching step may be a wet-development step of the photolithography technique. In the example shown in the present embodiment, the resin layer precursor layer 160 has photosensitivity, and is exposed and developed by using a photolithography technique.

Before the wet-etching step (more specifically, before the exposure), the resin layer precursor layer 160 may be pre-baked at, for example, about 80-100° C., to thereby evaporate solvent in the resin layer precursor layer 160. By so doing, the dissolution rate at the time of wet-etching can be made uniform. Also, when a resist layer R110 is provided on the resin layer precursor layer 160, and they are simultaneously exposed and developed, as described below, the pre-baking can make the dissolution rate of the resin layer precursor layer 160 to be slower than the dissolution rate of the resist layer R110.

Figure 7:
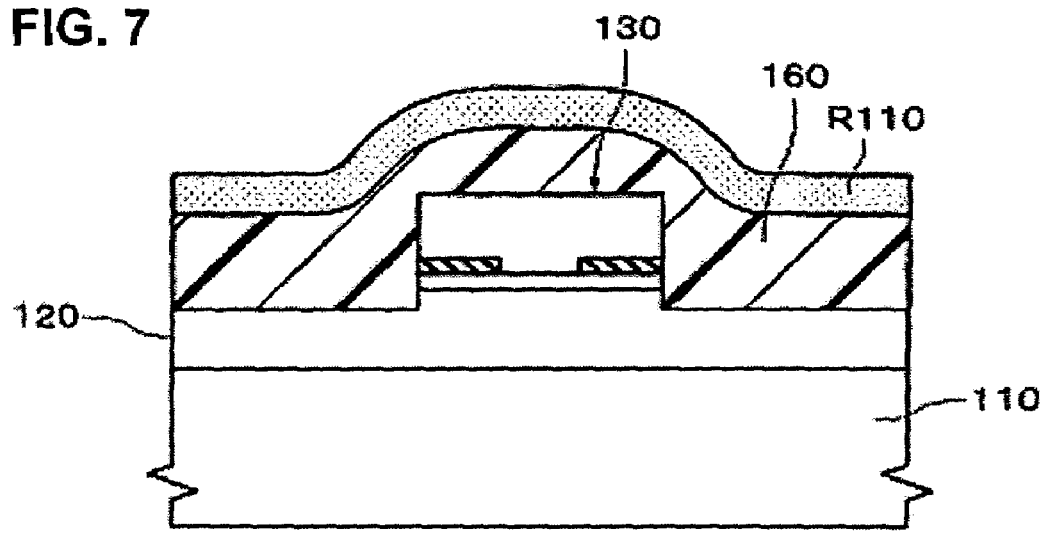
FIG. 7 is a view showing the method for manufacturing the optical element in accordance with the first embodiment of the present invention.
Figure 8:
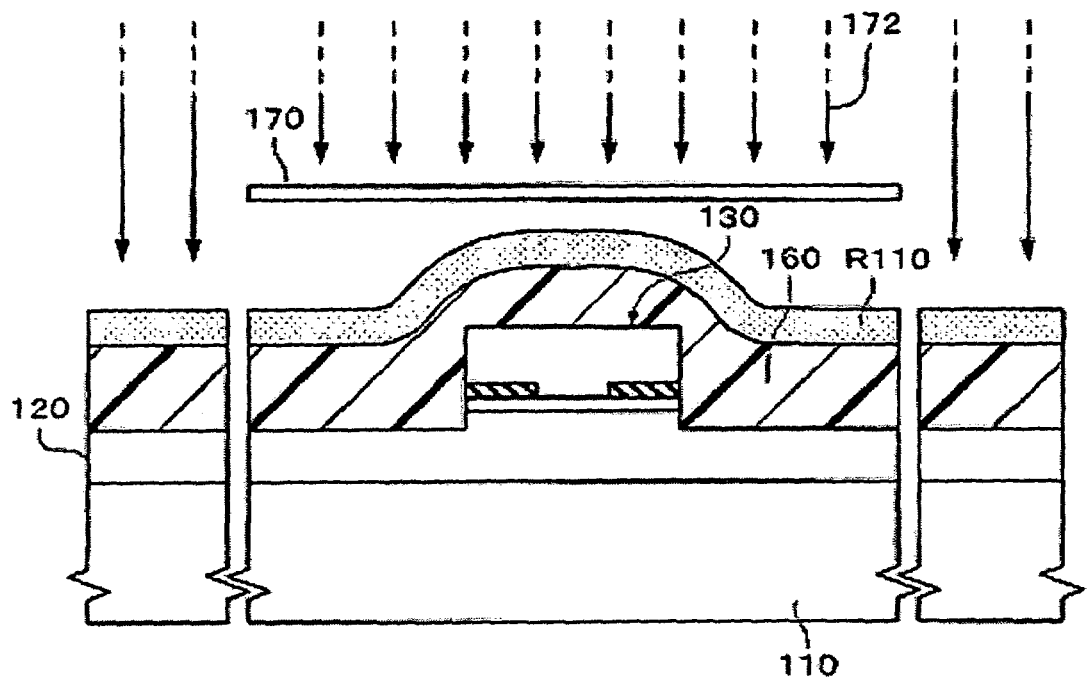
FIG. 8 is a view showing the method for manufacturing the optical element in accordance with the first embodiment of the present invention.
Figure 9:
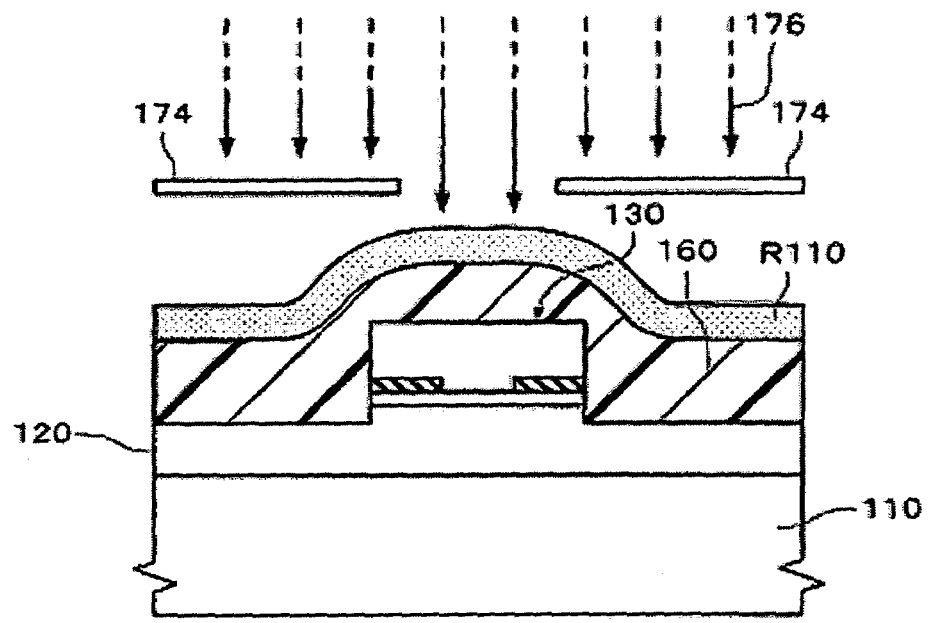
FIG. 9 is a view showing the method for manufacturing the optical element in accordance with the first embodiment of the present invention.

As indicated in FIG. 7, a resist layer R110 is provided on the resin layer precursor layer 160. The resist layer R110 is composed of a photosensitive resist. As the resist layer R110, a positive type in which solubility of a portion irradiated with light energy increases may be used.

First, as a first patterning step, a portion of the resin layer precursor layer 160 outside the columnar section 130 is removed. Concretely, a mask 170 is disposed above a region including the columnar section 130, and light energy 172 is irradiated. Areas of the resist layer R110 and the resin layer precursor layer 160 exposed through the mask 170 are irradiated with the light energy 172. By so doing, the resist layer R110 and the resin layer precursor layer 160 are exposed in a batch. Then, by submerging them in a developing solution, the areas exposed with the light energy 172 are removed in a batch. It is noted that, when a negative type resist layer in which solubility of a portion thereof irradiated with light energy reduces is used, areas to be irradiated with the light energy 172 may be reversed.

Next, as a second patterning step, a portion of the resin layer precursor layer 160 over the upper surface 132 of the columnar section is removed. Concretely, a mask 174 having an opening in a center area of the upper surface 132 of the columnar section 130 is disposed, and light energy 176 is irradiated. The resist layer R110 and the resin layer precursor layer 160 are exposed and developed in a batch in the same manner as described in conjunction with the first patterning step. The second patterning step is conducted by using the resist layer R110 that remains in the first patterning step as it is. By conducting patterning steps multiple times, optimum durations of time for exposure and development respectively can be secured, and the patterned shape can be optimized.

Figure 10:
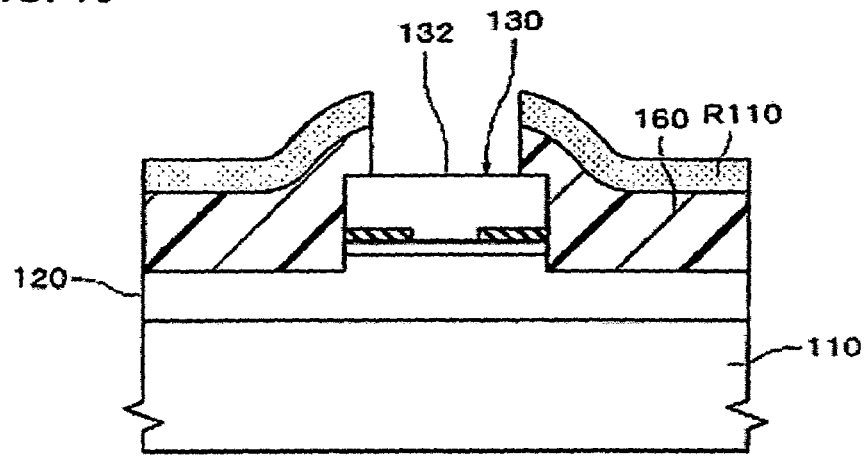
FIG. 10 is a view showing the method for manufacturing the optical element in accordance with the first embodiment of the present invention.
Figure 11:
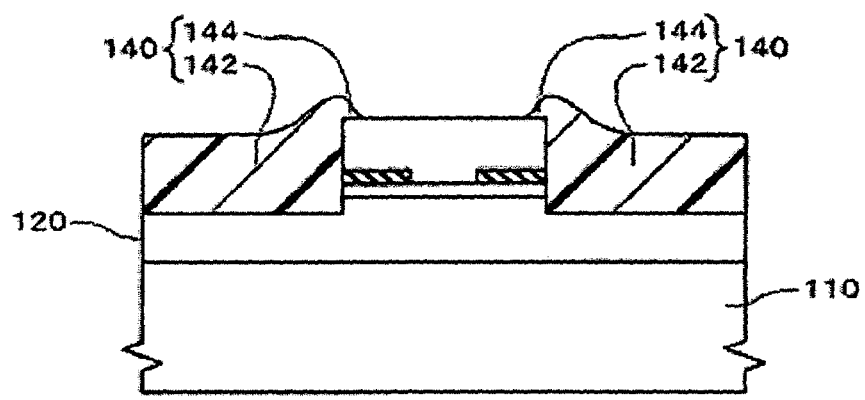
FIG. 11 is a view showing the method for manufacturing the optical element in accordance with the first embodiment of the present invention.

In this manner, as shown in FIG. 10, the center portion of the upper surface 132 of the columnar section 130 can be exposed. The resist layer R110 and the resin layer precursor layer 160 are provided not only around the columnar section 130 but also in an end section of the upper surface 132 of the columnar section 130. Then, the resist layer R110 is removed. The resist layer R110 may be dissolved and removed (by wet-etching) by using resist thinner (for example, LB thinner (trade name)) or the like. In this case, by using the difference between the dissolving rates with respect to the resist layer R110 and the pre-baked resin layer precursor layer 160, the entire resist layer R110 may be removed, and a surface layer portion of the resin layer precursor layer 160 may be removed. By so doing, an upper surface of the resin layer precursor layer 160 after the resist layer R110 has been removed can be made in a smooth curved surface. More specifically, over the upper surface 132 of the columnar section 130, the thickness of the resin layer precursor layer 160 gradually reduces in a direction from the circumference toward the center of the upper surface 132, such that disconnection of an electrode 150 to be described below can be effectively prevented.

Then, the resin layer precursor layer 160 is hardened. For example, the resin layer precursor layer 160 may be heated at about 350° C., whereby a resin layer 140 that is almost completely hardened can be formed. When a polyimide resin layer precursor layer is used as the resin layer precursor layer 160, the same is hardened by heating to thereby form a polyimide resin layer. The resin layer 140 includes the first and second sections 142 and 144 described above.

In the example described above, the patterning steps are conducted twice. However, the resist layer R110 and the resin layer precursor layer 160 may be patterned by a single patterning step. In this case, the film thickness of the resist layer R110 and the resin layer precursor layer 160 above the columnar section 130 and the film thickness thereof outside the columnar section 130 may be adjusted, whereby optimum durations of time for exposure and development may be secured.

In the example described above, the case where the resist layer R110 is provided is described. However, the resist layer R110 may not be provided, and the resin layer precursor layer 160 alone may be patterned. In this case, to make the upper surface of the resin layer precursor layer 160 into a smooth curved surface, wet-etching or the like may be applied again.

Alternatively, the resin layer precursor layer 160 may be formed from a non-photosensitive material. In this case, an ordinary wet-etching step may be applied to perform patterning.

It is noted that the resin layer 140 may not be formed on the upper surface 132 of the columnar section 130, and may be formed only around the columnar section 130.

(3) Next, a reinforcing layer 180 is formed (see FIG. 2).

The reinforcing layer 180 is formed in a region including an area above the resin layer 140. The reinforcing layer 180 is formed from a material harder than the resin layer 140. The reinforcing layer 180 may also be formed from an inorganic material, or a metal. For example, a silicon oxide layer or a silicon nitride layer may be formed as the reinforcing layer 180 by a sputter method or a CVD method. Then, the reinforcing layer 180 is patterned in order to open the optical surface 128 in the upper surface 132 of the columnar section 130. The patterning can be conducted by a photolithography technique and dry-etching. Because the reinforcing layer 180 is composed of a material harder than the resin layer 140, it achieves a high level of dimensional accuracy in etching, such that the opening region in the optical surface 128 can be accurately decided. Accordingly, this results in a manufacturing step that can achieve uniform characteristics in optical elements. It is noted that the reinforcing layers shown in FIG. 12 or FIG. 13 described above can be formed by changing their patterning regions.

(4) Lastly, electrodes 150 and 152 are formed (see FIG. 2). The electrode 150 is electrically connected to the second mirror 124, and the electrode 152 is electrically connected to the first mirror 122.

The electrode 150 is formed on the upper surface 132 of the columnar section 130 and the reinforcing layer 180. More specifically, the electrode 150 is passed over the first and second sections 142 and 144 of the resin layer 140, and is electrically connected to an end section of the exposed area of the upper surface 132 of the columnar section 130. Also, the electrode 152 is formed on the back surface (the surface opposite to the element section 120) of the substrate 110. Depending on the necessity, plasma treatment or the like may be used to wash the upper surface of the columnar section 130, the upper surface of the resin layer 140 and the back surface of the substrate 110. By this, an element with more stable characteristics can be formed.

Next, for example, a vapor deposition method is conducted to form a laminated film of, for example, Au and an alloy of Au and Zn. Then, by using a lift-off method, a part of the laminated film is removed, whereby the electrode 150 is patterned on the upper surface 132 of the columnar section 130 and on the reinforcing layer 180. In this instance, the center area of the upper surface 132 of the columnar section 130 opens through the laminated film, and a bottom surface of the opening section 154 defines an optical surface 128. It is noted that, instead of the lift-off method, a dry-etching method may be used to pattern the electrode 150.

Similarly, for example, a laminated film of, for example, Au and an alloy of Au and Ge may be patterned to form the electrode 152 on the back surface of the substrate 110. Then, an anneal treatment may be conducted. In this manner, the electrodes 150 and 152 are formed.

By the method for manufacturing an optical element in accordance with the present embodiment, the reinforcing layer 180 of a hard material is located as a base below the bonding section 156, deformation of the resin layer 140 which may be caused by stresses generated at the time of bonding can be effectively prevented, compared to the case where the soft resin layer 140 is provided as a base. Also, peeling of and damage to the electrode 150 caused by deformation of the resin layer 140 can be prevented.

Also, when the resin layer 140 is formed up to the end section of the upper surface 132 of the columnar section 130, adhesion between the resin layer 140 and the columnar section 130 can be improved. For this reason, even when the resin layer 140 contracts by heat more than the columnar section 130, the resin layer 140 can be prevented from peeling off the columnar section 130, and disconnection of the electrode 150 can be prevented accordingly. In other words, stresses that originate from hardening and contraction of the resin layer 140 can be alleviated, such that disconnection of the electrode 150 can be prevented.

It is noted that a method for manufacturing a semiconductor device in accordance with the present embodiment includes contents that can be derived from the explanation of the semiconductor device described above.

Second Embodiment

Figure 14:
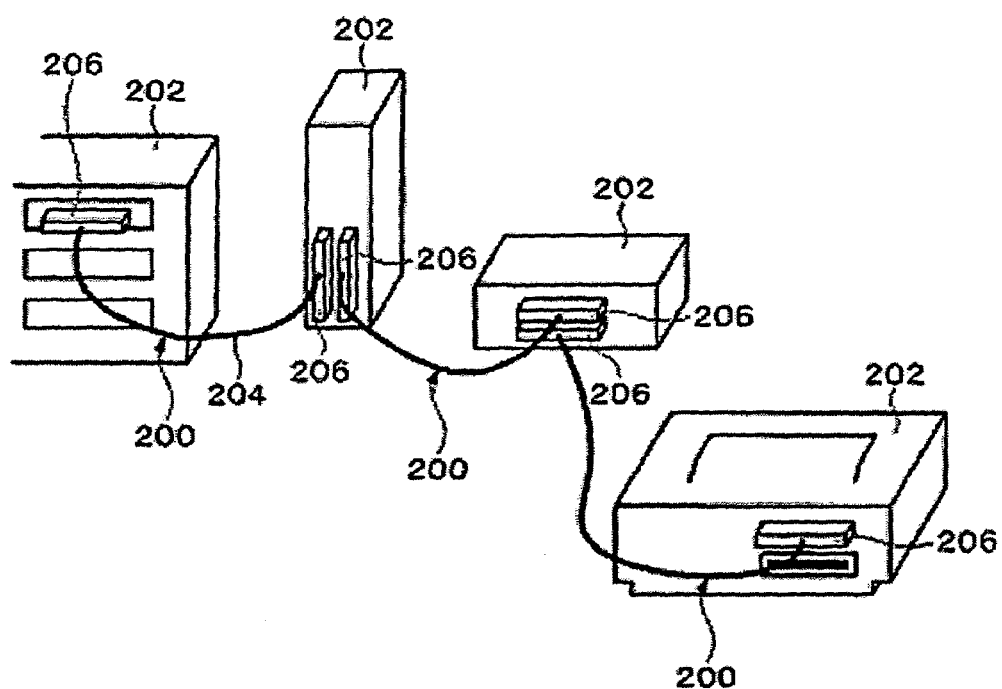
FIG. 14 is a diagram showing optical transmission devices in accordance with a second embodiment of the present invention.

FIG. 14 is a diagram showing optical transmission devices in accordance with a second embodiment of the present invention. The optical transmission devices 200 mutually connect electronic devices 202, such as, a computer, a display device, a storage device, a printer and the like. The electronic devices 202 may be information communication devices. The optical transmission device 202 may include a cable 204 and plugs 206 provided on both sides of the cable 204. The cable 204 includes an optical fiber. The optical element described above is built in the plug 206. The plug 206 may further include therein a semiconductor chip.

An optical element that is connected to one end of the optical fiber is a light emitting element, and an optical element that is connected to the other end of the optical fiber is a photodetector element. Electrical signals outputted from one of the electronic devices 202 are converted by the light emitting element into optical signals. The optical signals are transmitted through the optical fiber and inputted in the photodetector. The photodetector element converts the inputted optical signals into electrical signals. Then, the electrical signals are inputted in the other of the electronic devices 202. In this manner, with the optical transmission device 200 of the present embodiment, information can be transmitted among the electronic devices 202 by optical signals.

Third Embodiment

Figure 15:
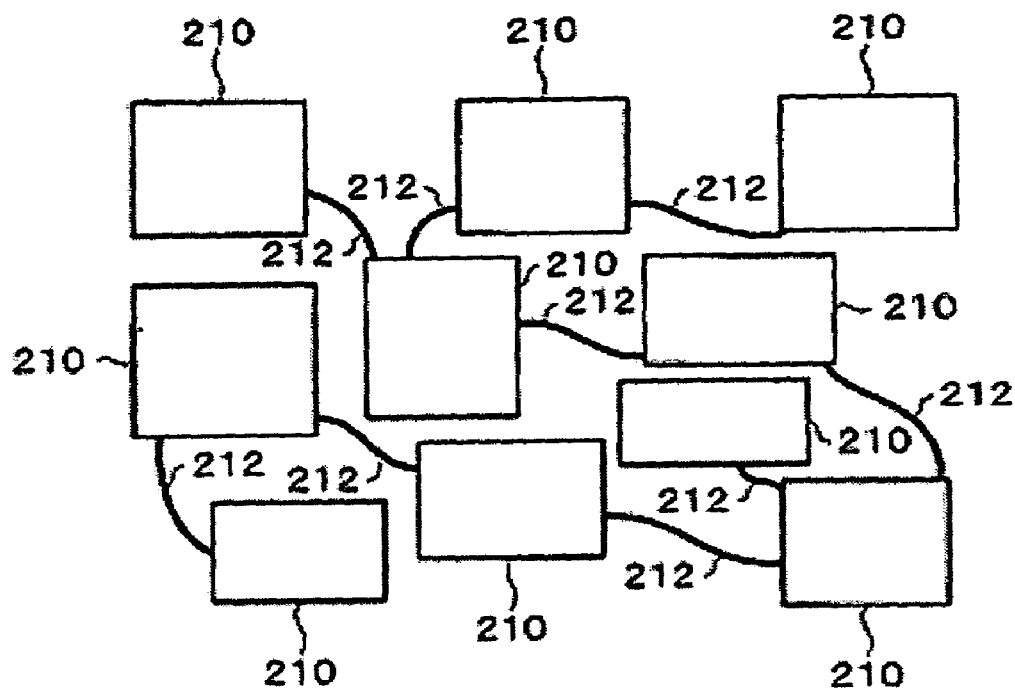
FIG. 15 is a diagram showing a usage configuration of optical transmission devices in accordance with a third embodiment of the present invention.

FIG. 15 is a diagram showing a usage configuration of optical transmission devices in accordance with a third embodiment of the present invention. Optical transmission devices 212 connect electronic devices 210. As the electronic devices 210, liquid crystal display monitors, digital CRTs (which may be used in the fields of finance, mail order, medical treatment, and education), liquid crystal projectors, plasma display panels (PDP), digital TVs, cash registers of retail stores (for POS (Point of Sale) scanning), videos, tuners, gaming devices, printers and the like can be enumerated.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that can achieve the same functions and effects or achieve the same objects of those of the compositions described in the embodiments. Furthermore, the present invention includes compositions that include publicly known technology added to the compositions described in the embodiments.

What is claimed is:

1. An optical element comprising:
 a substrate;
 a columnar section formed above the substrate and having an upper surface for light emission or incidence;
 a resin layer formed above the substrate and in a region including a circumference of the columnar section;
 a reinforcing layer that is formed above the resin layer and is composed of a material harder than the resin layer; and
 an electrode that has a bonding section formed above the reinforcing layer and is electrically connected to an end section of an exposed area in the upper surface of the columnar section.

2. An optical element according to claim 1, wherein the reinforcing layer is formed in a region including the entirety of the bonding section.

3. An optical element according to claim 1, wherein the reinforcing layer is formed in a region including the entirety of the layer.

4. An optical element according to claim 1, wherein the resin layer is formed in a portion above the substrate.

5. An optical element according to claim 4, wherein the reinforcing layer is formed in a region including the entirety of the resin layer and outside the resin layer.

6. An optical element according to claim 1, wherein the reinforcing layer is composed of an inorganic material.

7. An optical element according to claim 1, wherein the reinforcing layer is composed of a metal.

8. An optical element according to claim 1, wherein the resin layer includes a first section above the substrate and around the columnar section, and a second section provided at the end section of the upper surface of the columnar section.

9. An optical element comprising:
 a substrate;
 a lower mirror disposed above the substrate,
 an active region disposed above the lower mirror,
 an upper mirror disposed above the active region,
 a columnar section including at least the upper mirror and having an upper surface for light emission or incidence;
 a resin layer formed above the substrate and in a region including a circumference of the columnar section;
 a reinforcing layer that is formed above the resin layer and is composed of a material harder than the resin layer; and
 an electrode that has a bonding section formed above the reinforcing layer and is electrically connected to an end section of an exposed area in the upper surface of the columnar section.

10. An optical element according to claim 9, wherein the reinforcing layer is formed in a region including the entirety of the bonding section.

11. An optical element according to claim 9, wherein the reinforcing layer is formed in a region including the entirety of the resin layer.

12. An optical element according to claim 9, wherein the resin layer is formed in a portion above the substrate.

13. An optical element according to claim 12, wherein the reinforcing layer is formed in a region including the entirety of the resin layer and outside the resin layer.

14. An optical element according to claim 9, wherein the reinforcing layer is composed of an inorganic material.

15. An optical element according to claim 9, wherein the reinforcing layer is composed of an oxide or a nitride.

16. An optical element according to claim 9, wherein the reinforcing layer is composed of a metal.

17. An optical element according to claim 9, wherein the resin layer includes a first section above the substrate and around the columnar section, and a second section provided at the end section of the upper surface of the columnar section.

18. An optical element according to claim 9, wherein the reinforcing layer connect the lower mirror.

19. An optical element according to claim 9, wherein an adhesion between the reinforcing layer and the electrode is greater than an adhesion between the reinforcing layer and the resin layer.

20. A method for manufacturing an optical element, comprising:
 (a) forming, above a substrate, a columnar section having an upper surface for light emission or incidence;
 (b) forming a resin layer above the substrate and in a region including a circumference of the columnar section;
 (c) forming, above the resin layer, a reinforcing layer composed of a material harder than the resin layer; and
 (d) forming an electrode that has a bonding section above the reinforcing layer and is electrically connected to an end section of an exposed area in the upper surface of the columnar section.

* * * * *